United States Patent [19]
Tu et al.

[11] Patent Number: 5,863,397
[45] Date of Patent: Jan. 26, 1999

[54] TARGET MOUNTING APPARATUS FOR VAPOR DEPOSITION SYSTEM

[75] Inventors: C.C. Tu, Taipei; Y.H. Chen, Hsin-Chu, both of Taiwan

[73] Assignee: Taiwan Semiconductor Manufacturing Co Ltd., Hein-Chu, Taiwan

[21] Appl. No.: 891,376

[22] Filed: Jul. 11, 1997

[51] Int. Cl.$^6$ ................................................... C23C 14/34
[52] U.S. Cl. ................................. 204/298.12; 204/192.12
[58] Field of Search ..................... 204/298.12, 298.13, 204/192.12

[56] References Cited

U.S. PATENT DOCUMENTS 4,885,075  12/1989  Hillman ............................. 204/298.12
5,641,389   6/1997  Strauss et al. ..................... 204/298.12

*Primary Examiner*—Nam Nguyen
*Assistant Examiner*—Rodney G. McDonald
*Attorney, Agent, or Firm*—Tung & Associates

[57] ABSTRACT

Target mounting apparatus for use in a conventional physical vapor deposition system includes a target assembly, a source mounting plate, means for removably mounting the target assembly on the source mounting plate, and a keying system for preventing mounting of a target assembly which is incompatible with the deposition process intended to be carried out. The keying system includes a male portion formed on either the target assembly or the source mounting plate, and a female portion formed on the other of the target assembly and the source mounting plate. Keying of the target assembly to the source mounting plate is achieved by either forming the male and female portions with unique, mating cross sectional shapes, or by varying the spatial orientation or alignment of the male and female portions. In an alternate embodiment, a key pin is positionable in any of a plurality of positions on the source mounting plate, respectively corresponding to differing target assemblies. A target assembly can only be mounted on the source mounting plate when the key pin is in a corresponding correct position, thus acting as a positive reminder to the equipment operator to install the correct target assembly for the process to be carried out.

15 Claims, 4 Drawing Sheets

TARGET MOUNTING APPARATUS FOR VAPOR DEPOSITION SYSTEM

FIELD OF THE INVENTION

The present invention generally relates to improvements in the components of a physical vapor deposition system, and deals more particularly with a novel arrangement for interchangeably mounting any of a plurality of target assemblies within the deposition chamber, in a manner which prevents mounting a target assembly having a material which is incompatible with that of the deposition process intended to be performed.

BACKGROUND OF THE INVENTION

Physical vapor deposition (PVD) is a frequently used processing technique in which a metal is deposited onto a substrate. The most common forms of PVD are evaporation, e-beam evaporation, plasma spray deposition, and sputtering. Evaporation and e-beam evaporation were used extensively in the manufacture of earlier generations of medium and large scale integrated circuits, but have since been replaced by sputtering, in which semiconductor wafers are produced by the deposition or "sputtering" of a metallic layer on the surface of a silicon wafer.

Sputtering possesses a number of advantages over other types of PVD processes, including relatively high deposition rates, the ability to deposit and maintain complex alloy compositions, the ability to deposit high temperature and refractory metals, the ability to maintain well-controlled, uniform deposition on large wafers, and the capability in multi-chamber systems to clean the contact before depositing metal.

In a sputtering process, inert gas particles are first ionized in an electrical field to produce a gas plasma within a sealed deposition chamber. The ionized particles are then directed toward a source or target where the energy of these gas particles physically dislodges, or "sputters" off, atoms of the metallic source material.

In a typical PVD process chamber, major components include a stainless steel chamber that is certified vacuum-tight with a helium leak detector, a pumping capacity that is capable of reducing the chamber pressure to about $10^{-6}$ Torr or below, pressure gauges, a sputter source or target, a power supply, and a wafer holder. The sputter source and wafer holder are normally positioned facing each other. The target may be, for example, an aluminum (Al) or titanium (Ti) disc used as the sputter source for the process. The target has different sizes, for instance, a 13-inch (330 mm) target is normally used for processing an 8-inch (200 mm) wafers. The target is bonded to a backing plate and has a life expectancy depending upon the power consumption of the process and the target material used.

In recent years, more stringent requirements of film quality and increasing wafer sizes have driven the manufacturing technology away from very large batch systems toward single-wafer processing system. Many integrated process systems that combine several process technologies in a single machine are becoming available in the marketplace. In such integrated process systems, a wafer can be transported from one single-wafer process chamber or module to another through a central transfer chamber without breaking vacuum. Consequently, much of the modern processing equipment is being designed for single-wafer use in multi-chamber clustered integrated processing systems.

In a typical multi-chamber clustered integrated processing system for PVD, thin or thick metal or barrier metal films can be deposited on silicon wafers of various sizes. For instance, four PVD process chambers can be connected to a transfer chamber which is then connected to other chambers such as a pre-clean chamber, a cool down chamber, a buffer chamber for wafer handling, and a load-lock.

PVD systems of the type described above are often used to carry out different kinds of processes, i.e., different types of metals are deposited onto different kinds of substrates. Consequently, when switching between different processes, it is typically necessary to purge and clean the deposition chamber, and change target sources so that a different metal can be deposited. This presents a number of problems in assuring that the correct target material is used in the intended deposition process. When there is a change to a different deposition step or process, it may be necessary to change the target material so that the target material being deposited is properly matched to the step or process.

The problem of installing a target assembly with the correct target materials is compounded by the fact that different target materials possess essentially the same physical characteristics, thus making it difficult, and sometimes impossible for an operator to distinguish between target materials. The similarity in appearance between target materials sometimes results in the incorrect target assembly being installed on the source mounting plate, i.e., the target material is incompatible or incorrect with the process or step to be carried out.

The present invention is intended to overcome each of the deficiencies of the prior art mentioned above.

It is therefore an important object of the present invention to provide a target mounting apparatus which eliminates or reduces a possibility of installing an incorrect or unintended target assembly in a PVD process chamber.

A further object of the present invention is to provide a target mounting apparatus which provides a reminder to the equipment operator that a target assembly possessing a specific type of target material must be installed prior to commencement of the next deposition process.

Another object of the present invention is to provide target mounting apparatus that includes physical indicia which acts as positive identification of the target material carried on a particular target assembly.

A still further object of the present invention is to provide target mounting apparatus as aforesaid possessing a simple keying arrangement in which target assemblies are physically keyed to a mounting plate, consistent with the deposition process desired to be carried out.

These, and further objects and advantages of the present invention will be made clear or will become apparent during the course of the following description of a preferred embodiment of the invention.

SUMMARY OF THE INVENTION

In accordance with one embodiment of the present invention, a novel target mounting apparatus is provided for a physical vapor deposition system, in which target assemblies carrying target materials are positively identified and matched to deposition processes to be carried out in the system. The system includes a source mounting plate, one or more target assemblies carrying preselected target materials, means for removably mounting the target assembly on the source mounting plate, and a keying system for keying each of the target assemblies with a preselected deposition process intended to be carried out. The keying system includes a male protrusion in the form of a pin inserted in any of a plurality of positions on the source mounting plate, each of such mounting positions corresponding to a respectively associated deposition process requiring the use of a specific target material. Each of the target assemblies includes a female depression in the form of a cavity or slot corresponding to the shape of the pin and spatially positioned to match one of the mounting slots in the source mounting plate. In order to assure that the proper target assembly is used in a given deposition process, the operator moves the key pin to the mounting slot corresponding to that particular process, and then installs the target assembly on the plate. Only those target assemblies having a pin slot aligned with the selected pin position may then be installed on the source mounting plate, thus precluding the use of target assemblies with incorrect or incompatible target materials.

According to another embodiment of the present invention, the keying system matches the target assemblies to both the intended deposition process and to other materials that may be present in the deposition chamber, so that the target material is compatible with the deposition process. In one form of this keying system, a first portion in the form of a male protrusion is carried on either the source mounting plate or the target assembly, and a second portion in the form of a female depression or cavity is carried on the other of the source mounting plate or target assembly. Keying is achieved either by matching the cross-sectional shape of the male and female portions so that they matingly receive each other without interference, or the male and female portions are spatially distributed or axially oriented to form matching assemblies between the mounting plate and target assembly.

BRIEF DESCRIPTION OF THE DRAWINGS

In the drawings, wherein like reference numerals are employed to designate identical components in the various views, and wherein other objects, features and advantages of the present invention will become apparent.

DETAILED DESCRIPTION OF THE PREFERRED EMBODIMENTS

Figure 1:
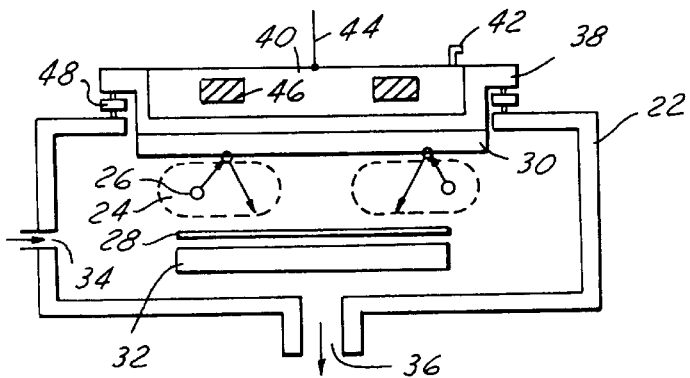
FIG. 1 is a simplified, diagrammatic view of a magnetron type sputtering system in which the target mounting apparatus of the present invention may be employed.

The present invention broadly relates to improvements in mounting target assemblies within chambers employed to carry out PVD processes. FIG. 1 depicts a typical magnetron type sputtering system for carrying out PVD processes wherein a target or source material 30, typically a metal, is sputtered or deposited onto a substrate which may be, for example, a silicon wafer 28. The target 30 may be in the form of a disc secured to a source mounting plate 38, and is disposed within a vacuum chamber 22, along with the substrate 28 and a heater 32 for heating the substrate 28. The chamber 22 includes an outlet 36 connected with a vacuum pump for evacuating the chamber 22, as well as an inlet 34 for allowing the introduction of an inert gas such as Argon which forms a plasma within the chamber 22 during the deposition process. The source mounting plate 38 carries a cathode 40 connected to a power supply 44 and is insulated from the chamber 22 by a ceramic insulator 48. The cathode 40 is provided with cooling water inlet/outlets 42 in order to dissipate heat absorbed by the sputtering target 30. Magnets 46 mounted on the cathode rotate along with the cathode 40 and function to increase the uniformity of the metal film deposited on the substrate 28.

In operation, argon plasma 24 generated by glow discharge, possesses charged ions 26 which are propelled into the target 30. The momentum of these argon ions 26 results in the ejection of atoms from the surface of the target 30 which in turn are deposited onto the surface of the substrate 28.

Figure 2:
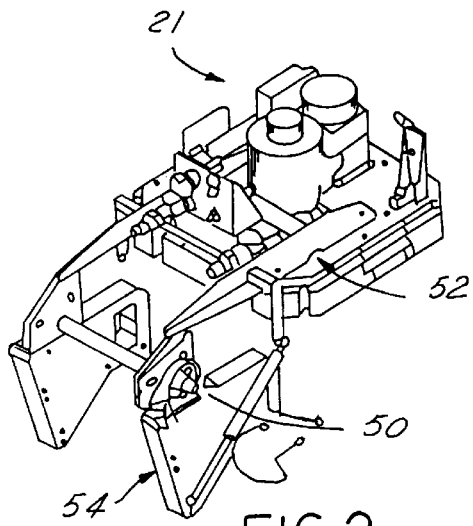
FIG. 2 is a perspective view of a typical PVD process chamber which includes the components of the sputtering system shown in FIG. 1.
Figure 3:
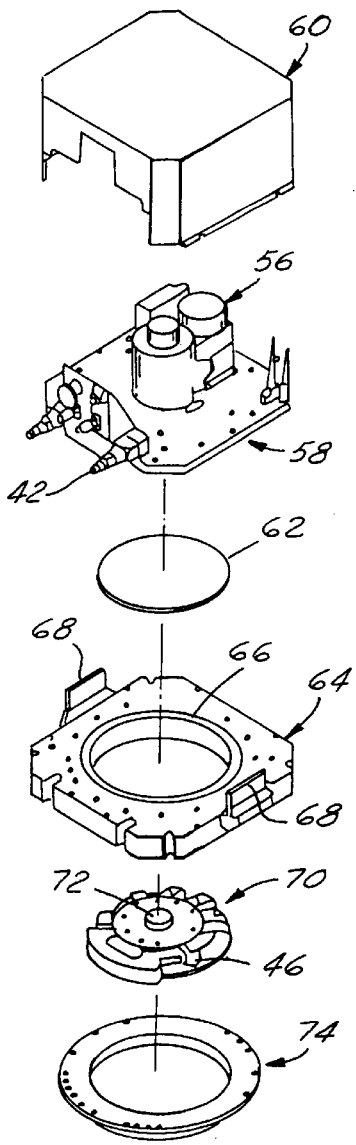
FIG. 3 is an exploded view of the component parts of the PVD process chamber shown in FIG. 2.
Figure 4:
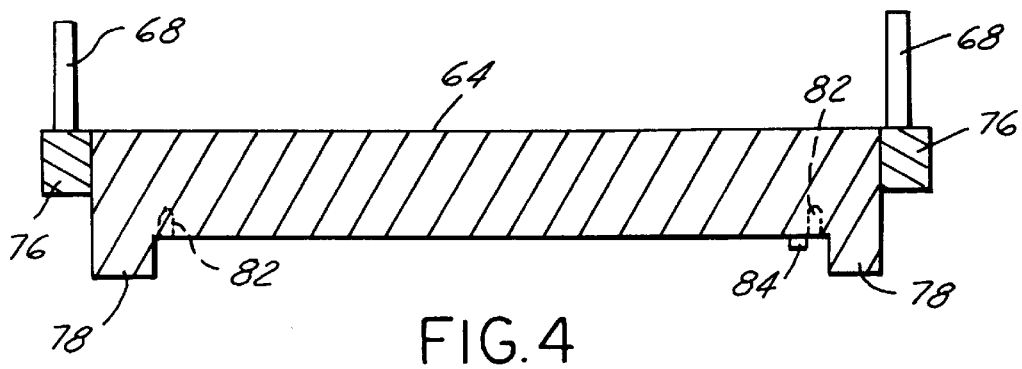
FIG. 4 is a cross-sectional view of a source mounting plate which forms one component of the chamber shown in FIGS. 2 and 3.
Figure 5:
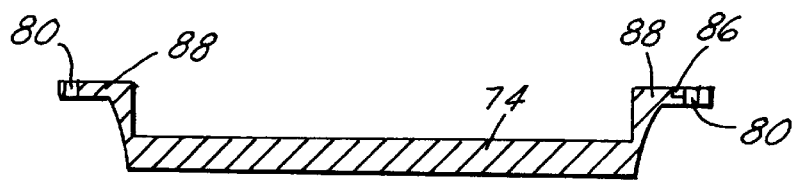
FIG. 5 is a cross-sectional view of a target assembly forming one of the components of the PVD process chambers of FIGS. 2 and 3.
Figure 6:
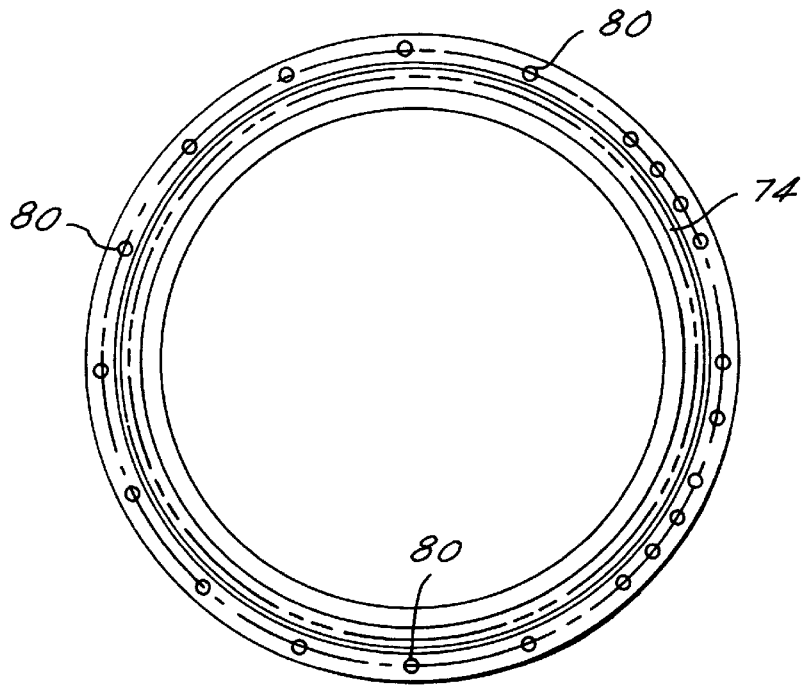
FIG. 6 is a top plan view of the target assembly shown in FIG. 5.

Referring now also to FIGS. 2 and 3, a source head assembly 21 is mounted for swing-away movement on the chamber 22 by means of mounting arms 52, supporting brackets 54 and a hinge arrangement 50. The source head assembly 21 includes a sealing plate 58 carrying a magnet rotation assembly 56 provided with a motor (not shown), a chamber cover 60, O-ring 62, source mounting plate 64, magnet assembly 70 and a target assembly 74. The sealing plate 58 includes a cooling water manifold provided with inlet/outlets 42. The O-ring 62 provides a tight seal between the bottom of the sealing plate 58 and the top surface of the source mounting plate 64. Source mounting plate 64 includes a central opening surrounded by a groove 66 for receiving the O-ring 62 as well as a pair of carrying handles 68 mounted on a pair of extensions 76 (FIG. 4) carried on opposite sides of the plate 64. The magnet assembly 70 includes a plurality of circumferentially spaced magnets 46 and a central key 72 for receiving a drive shaft (not shown) which is rotated by a motor forming part of the magnet rotation assembly 56. The target assembly 74 is mounted to the underside of the source mounting plate 64 using mounting means and a keying system which will be discussed below.

Figure 7:
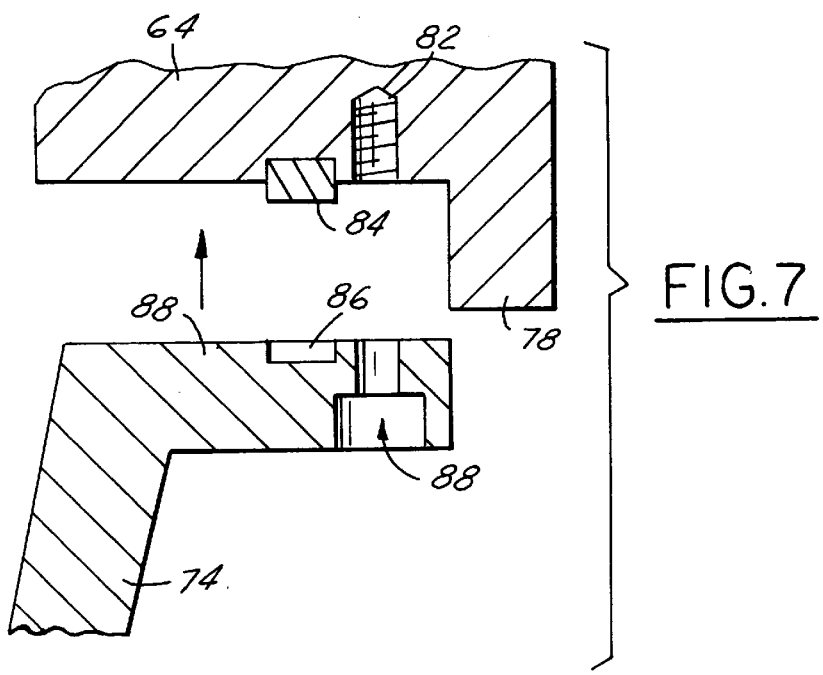
FIG. 7 is a fragmentary, cross-sectional, exploded view showing a portion of the peripheries of the source mounting plate and target assembly during installation of the target assembly.
Figure 8:
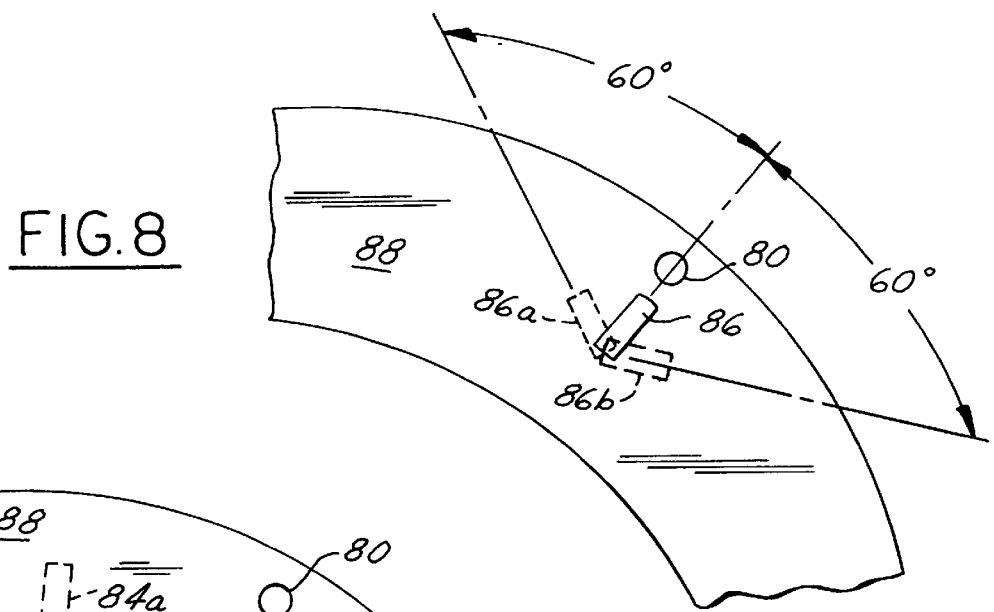
FIG. 8 is a fragmentary, plan view of a portion of a target assembly, and showing two alternate axial orientations of pin slots forming the female portion of the keying system.

Referring now also to FIGS. 4~8, the target assembly 74 includes a central opening within which there is mounted a target material, and a circumferentially extending, axially offset mounting ring 88. Mounting ring 88 is provided with a plurality of through holes 80 which are countersunk to receive bolts (not shown) that extend into the threaded holes 82 in the bottom surface of the source mounting plate 64. According to one embodiment of the invention, a keying system is provided which assures that the target assembly 74 installed on the mounting plate 64 possesses a target material which is correct for the deposition process to be carried out. According to this embodiment, the keying system includes a male portion 84 carried on the bottom of the mounting plate 64, and a female portion in the form of a depression, slot or cavity 86 formed in the top surface of the mounting ring 88. Male portion 84 may be attached to or formed integral with the mounting plate 64. In the illustrated embodiment, male portion 84 is in the shape of a rectangular pin which extends downwardly beyond the lower surface of the mounting plate 64. In one preferred embodiment, a plurality of pin mounting slots are formed in the lower surface of the mounting plate 64, respectively representing a plurality of choices of positions in which the pin 84 may be set. In the illustrated embodiment, three pin positions are shown which are angularly offset 60 degrees from each other about a common axis corresponding to the axis along which the target assembly 74 is moved when it is installed onto the source mounting plate 64. As shown in FIGS. 7 and 8, the pin 84 is mounted in its central mounting position, axially aligned and registered with a correspondingly configured pin slot 86 shown in FIG. 8. Alternate target assemblies 74 possessing different target materials (not shown) are respectively provided with angularly offset pin slots 86a and 86b, corresponding in alignment and registration with those formed in the mounting plate 64.

In use, before a new deposition process is carried out, the equipment operator repositions the pin 84 in one of the mounting slots which corresponds to the process to be carried out. For example, the pin position shown in FIG. 7 might correspond, for example, with a process in which a Ti is intended to be used. With the key pin 84 in this position, only a correspondingly keyed target assembly 74 possessing a Ti target may be installed on the mounting plate 64. As shown in FIG. 7, with the proper target assembly selected, mounting ring 88 is moved into proximity with the bottom surface of the mounting plate 64, with a circumferential lip 78 on the mounting plate 64 acting as a guide. Continued displacement of the target assembly 74 results in the pin 84 being received within the pin slot 86, thus allowing the upper surface of the ring 88 to come into face to face contact with the bottom surface of the mounting plate 64, so that bolts (not shown) may be screwed into the mounting holes 80 and 82. In the event that the operator selects a target assembly 74 having an incorrect target material, the pin 84 will not be aligned and registered with the pin slot 86 formed in the mounting ring 88, thus resulting in an interference that will prevent proper seating of the mounting ring 88 onto the mounting plate 64. This mounting interference will alert the operator that he is attempting to install a target assembly 74 that is incorrect for the intended deposition process.

Figure 9:
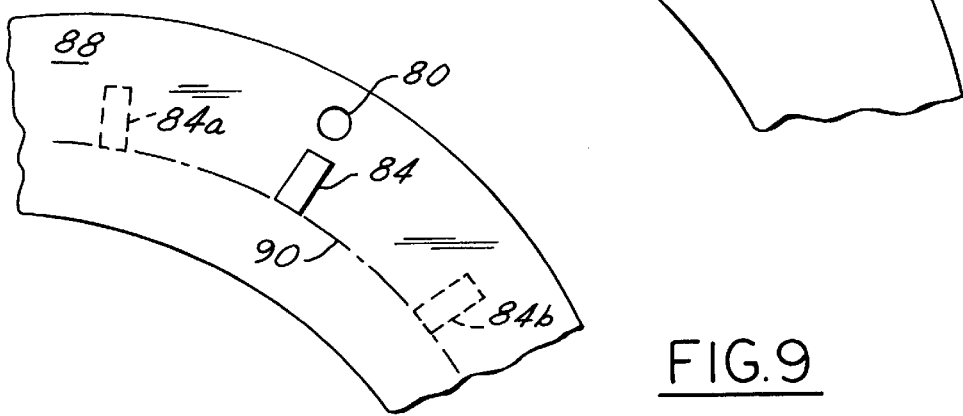
FIG. 9 is a view similar to FIG. 8 but showing alternate, circumferentially spaced locations for the pin slots.

The novel keying arrangement described above may be expeditiously implemented using other arrangements for forming the pin mounting positions in the mounting plate 64, and corresponding pin slots in the target assembly 74. For example, as shown in FIG. 9, the pin mounting positions and corresponding pin slots 86, 86a, 86b may be circumferentially spaced at preselected locations along the perimeter of the mounting ring 88. In FIG. 9, the pin slot indicated at 86 in full line corresponds to the position of the pin 86 in FIG. 7, whereas the alternate pin slots 86a and 86b indicated in the phantom respectively correspond to two other target assemblies (not shown) carrying different kinds of target materials.

Figure 10A:
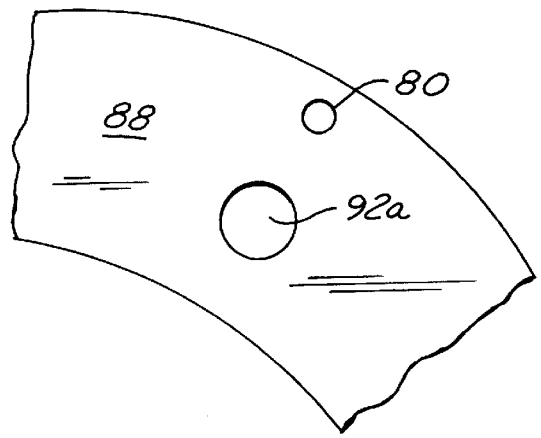
FIGS. 10A~10C are each views similar to those in FIGS. 8 and 9, but respectively depict alternate forms of the pin slots with differing cross-sectional shapes.
Figure 10C:
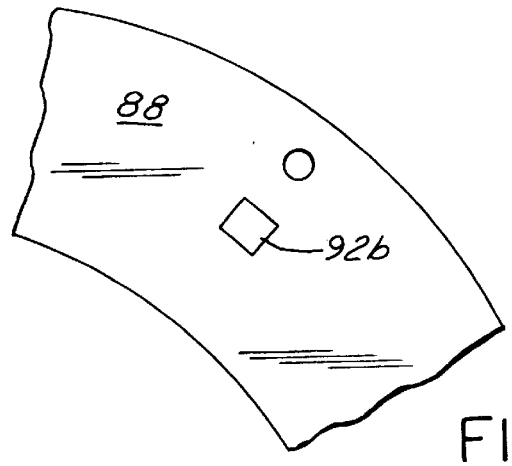
Figure 10B:
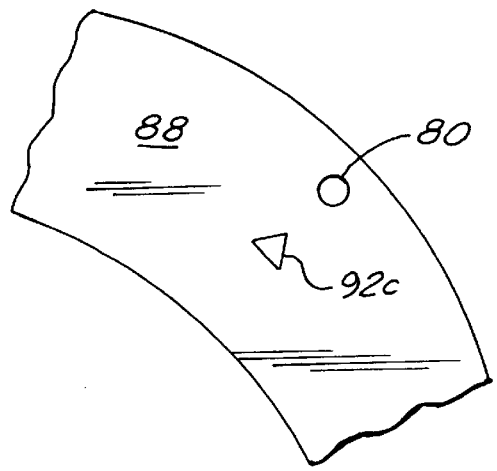

Attention is now directed to FIGS. 10A~10C, wherein another embodiment of the novel keying system is depicted. Instead of varying the axial position of the key pins and slots as in FIG. 8, or their spatial positions as shown in FIG. 9, it may be preferable to conveniently change the geometric cross-section of the pins and their corresponding slots. This latter mentioned arrangement is shown in FIGS. 10A~10C wherein FIG. 10A shows a circular cavity or slot 92a, FIG. 10B shows a triangular slot 92c and FIG. 10C shows a square slot 92b. The cross-sectional shapes of the key pins 84 would be formed to match those of the slots 92a, 92b and 92c thus again, keying each of the target assemblies 74 with either a specifically desired deposition process or other materials within the chamber.

Figure 11:
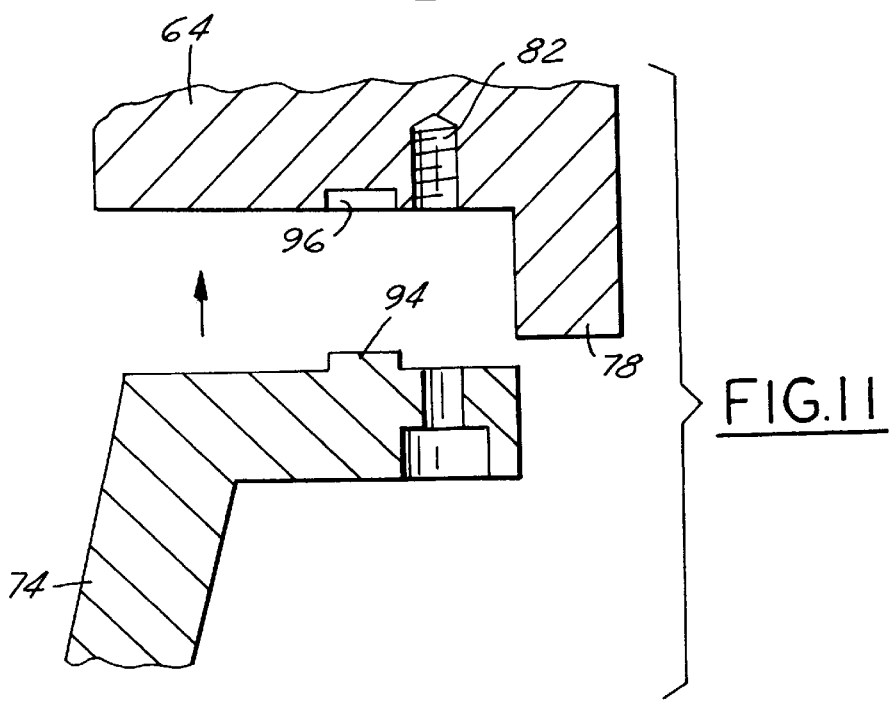
FIG. 11 is a view similar to FIG. 7, showing an alternate form of the keying system.

Referring finally to FIG. 11, the male portion or key pin 94 may be formed on the target assembly 74, rather than on the mounting plate 64 as in the above embodiments, in which case a correspondingly shaped and positioned key slot 96 is formed on the bottom surface of the source mounting plate 64.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiments of the invention in which an exclusive property or privilege is claimed are defined as follows:

1. For use in a vapor deposition system including a deposition chamber in which material from a target is deposited onto substrates placed within said chamber a target mounting apparatus, comprising:

at least first and second target assemblies respectively including different target materials to be deposited onto said substrates, and used in carrying out differing deposition processes within said deposition chamber, a mounting plate for mounting each of said target assemblies within said deposition chamber, means for removably mounting each of said target assemblies within said deposition chamber, a keying system carried on said mounting plate and each of said target assemblies for respectively keying each of said target assemblies with said mounting plate, such that the target assembly mounted on said mounting plate is matched to the desired deposition process, said keying system includes:

a key pin, a plurality of mounting slots in said mounting plate and each formed to removably mount said key pin therein, said mounting slots respectively representing a plurality of choices of mounting positions of said key pin on said mounting plate, key pin slots in each of said target assemblies, the position of each of said key pin slots being uniquely related to one of said deposition processes, and operative to receive said key pin therein when said key pin is mounted on a mounting slot in said mounting plate corresponding to the desired deposition process.

2. The target mounting apparatus of claim 1, wherein said mounting slots are angularly spaced apart from each other about a reference axis.

3. The target mounting apparatus of claim 1, wherein said mounting plate includes a generally circular outer periphery and said mounting slots are circumferentially spaced about a portion of said periphery of said mounting plate.

4. The target mounting apparatus of claim 1, wherein each of said target assemblies includes an outer mounting ring and said key pin slots are respectively formed in the mounting rings of said target assemblies.

5. For use in a physical vapor deposition system including a deposition chamber in which material from a target is deposited onto a substrate within said chamber, a target mounting apparatus, comprising:

a plurality of target assemblies, each including a unique target material to be deposited onto said substrate, a mounting plate for mounting any one of said target assemblies within said deposition chamber, means for removably mounting any one of said target assemblies on said mounting plate, a keying system carried on said mounting plates and said target assemblies for keying each of said target assemblies to a deposition process to be carried out in said deposition chamber, said keying system providing the operator of the deposition system with positive identification of each target assembly at the time the target assembly is being mounted onto the mounting plate, whereby to correctly match the target material to the deposition process, said keying system includes a first portion disposed on one of said target assemblies and said mounting plate, and a second portion disposed on the other of said target assemblies and said mounting plate, said first portion includes a male protrusion mountable on said mounting plate in any of a plurality of choices of positions respectively representing differing compatible combinations of target assemblies and deposition processes.

6. The target mounting apparatus of claim 5, wherein said second portion includes a female depression for matingly receiving said male protrusion therein to form a compatible pair.

7. The target mounting apparatus of claim 6, wherein said male protrusion is formed on said mounting plate and said female depression is formed on said target assemblies.

8. The target mounting apparatus of claim 6, wherein said male protrusion is formed on said target assemblies and said female depression is formed on said mounting plate.

9. The target mounting apparatus of claim 6, wherein said male protrusion and said female depression possess matching cross sections forming a key allowing interference free passage of said male protrusion into said female depression.

10. The target mounting apparatus of claim 6, wherein the compatible pair of said male protrusion and said female depression is spatially distributed from other compatible pairs of male protrusions and female depressions.

11. The target mounting apparatus of claim 10, wherein said other compatible pairs are spaced about the periphery of said mounting plate.

12. The target mounting apparatus of claim 6, wherein the compatible pair of said male protrusions and said female depressions are angularly displaced from each other about a common reference axis.

13. The target mounting apparatus of claim 6 wherein:

each of said target assemblies includes an outer mounting ring engaging said mounting plate, and one of said male protrusions and said female depressions are formed on said mounting ring.

14. The target mounting apparatus of claim 5, wherein said keying system includes:

a key pin, means for mounting said key pin in any of a plurality mounting positions on said mounting plate, each of said mounting positions being associated with a corresponding one of said target assemblies, and a plurality of pin slots respectively formed in said target assemblies and associated with said mounting positions on said mounting plate, each of said pin slots uniquely identifying a corresponding target assembly and being matched to an associated one of said mounting positions.

15. For use in a vapor deposition apparatus including a deposition chamber in which material from a target is deposited onto substrates placed within said chamber, a target mounting apparatus, comprising:

at least first and second target assemblies respectively used in carrying out first and second deposition processes in said chamber, said target assemblies respectively including first and second target materials to be sputtered onto said substrates, a mounting plate for carrying either of said target assemblies, means for removably mounting each of said target assemblies on said mounting plate, means for keying said first and second target assemblies respectively with said first and second deposition processes, to thereby assure correct matching of a target material to a deposition process, said keying means includes a male portion and a female portion, said male portion includes a key pin carried on said mounting plate and said female portion includes a key pin slot carried on each of said target assemblies, and said mounting plate includes a plurality of mounting slots therein and each formed to removably mount said key therein, said mounting slots respectively representing a plurality of choices of mounting positions of said key pin on said mounting plate, the positions of said key pin slots in said target assemblies being respectively uniquely related to said first and second deposition processes, and operative to receive said key pin therein when said key pin is mounted in a mounting slot corresponding to the desired deposition process.

* * * * *